(12) United States Patent
Magnusson et al.

(10) Patent No.: US 8,174,678 B2
(45) Date of Patent: May 8, 2012

(54) LITHOGRAPHIC APPARATUS WITH ADJUSTED EXPOSURE SLIT SHAPE ENABLING REDUCTION OF FOCUS ERRORS DUE TO SUBSTRATE TOPOLOGY AND DEVICE MANUFACTURING METHOD

(75) Inventors: Sven Gunnar Krister Magnusson, Veldhoven (NL); Martin Jules Marie-Emile De Nivelle, Eindhoven (NL); Frank Staals, Eindhoven (NL); Wim Tjibbo Tel, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 560 days.

(21) Appl. No.: 12/329,076

(22) Filed: Dec. 5, 2008

(65) Prior Publication Data
US 2009/0153821 A1 Jun. 18, 2009

Related U.S. Application Data

(60) Provisional application No. 61/006,072, filed on Dec. 17, 2007.

(51) Int. Cl.
  *G03B 27/54* (2006.01)
  *G03B 27/32* (2006.01)
(52) U.S. Cl. .......................... 355/67; 355/39
(58) Field of Classification Search .................. 355/53
  See application file for complete search history.

(56) References Cited

U.S. PATENT DOCUMENTS

| | | | |
|---|---|---|---|
| 5,194,893 A | 3/1993 | Nishi | |
| 5,238,870 A * | 8/1993 | Tanaka | 438/296 |
| 2002/0015142 A1 * | 2/2002 | Suzuki et al. | 355/71 |
| 2006/0268252 A1 * | 11/2006 | Na | 355/67 |

FOREIGN PATENT DOCUMENTS

| | | |
|---|---|---|
| JP | 2004277612 A | 10/1992 |
| JP | 2008037150 A | 2/1996 |
| JP | 2004259815 A | 9/2004 |

OTHER PUBLICATIONS

Office Action in related Japanese application No. 2008-309423 mailed May 2, 2011.

* cited by examiner

*Primary Examiner* — Edward Glick
*Assistant Examiner* — Michelle Iacoletti
(74) *Attorney, Agent, or Firm* — Pillsbury Winthrop Shaw Pittman LLP

(57) ABSTRACT

A lithographic apparatus includes an illumination system to condition a radiation beam; a patterning device support to support a patterning device, the patterning device capable of imparting the radiation beam with a pattern in its cross-section to form a patterned radiation beam; a substrate table constructed to hold a substrate, and a projection system to project the patterned radiation beam in a scanning exposure along a scanning direction onto a target portion of the substrate. The illumination system is configured to form in a plane of the patterning device a slit shaped image. The slit shaped image has a curved shape with a slit curvature in the scanning direction, with a length in the scanning direction and a width perpendicular to the scanning direction. The slit shaped image is configured to create a curved pattern image portion of the patterned radiation beam in an image plane of the projection system.

19 Claims, 3 Drawing Sheets

LITHOGRAPHIC APPARATUS WITH ADJUSTED EXPOSURE SLIT SHAPE ENABLING REDUCTION OF FOCUS ERRORS DUE TO SUBSTRATE TOPOLOGY AND DEVICE MANUFACTURING METHOD

CROSS-REFERENCE TO RELATED APPLICATIONS

This application claims priority and benefit under 35 U.S.C. §119(e) to U.S. Provisional Patent Application Ser. No. 61/006,072, entitled "Lithographic Apparatus With Adjusted Exposure Slit Shape Enabling Reduction Of Focus Errors Due To Substrate Topology and Device Manufacturing Method", filed on Dec. 17, 2007. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A semiconductor substrate on which the IC is manufactured typically exhibit some variation of the surface level: the surface of a substrate is typically not flat. Typically, the surface level varies as a function of the position on the substrate around an average level. To some extent, such surface level variations are induced by the manufacturing process of the substrate. One of the components of the surface level variation can be characterized as a (local) curvature of the surface. In practice, local surface level variations due to curvature may be several tens of nanometers.

In particular, for lithographic apparatus that can achieve critical dimension values of the same order as the local curvature, a compensation for this curvature may be needed. Due to the relatively small focal depth of the projection system of such a lithographic apparatus, a local deviation between the image plane including the image and the surface level due to curvature may result in a local defocus. As a consequence, the pattern as created on the surface may be inaccurate with regard to the size and/or position of features of the pattern.

Due to the fact that the image created by the projection system, has a fixed shape (i.e., it is usually calibrated towards a planar surface), the exposure on the substrate with curvature or varying curvature as a function of position on the substrate will result in a pattern image of which the focus quality may vary as a function of the position within the image. In particular, edges of substrate may suffer from curvature (variations) which may affect the possibility to print a pattern near those edges of the substrate.

In a scanner lithographic system as described above, the pattern image is created during scanning by imaging a section of the patterning device (e.g. mask) onto the substrate. The projected image of this section, here referred to as the exposure slit has a rectangular shape. The width of the slit (that is in the direction perpendicular to the scanning direction) corresponds to the width of an exposure field in which the pattern is imaged. The length of the slit in the scanning direction is typically much shorter than the width of the slit. For this reason, the largest effect of curvature on defocus may occur in the non-scanning direction.

Defocus due to curvature along the scanning direction may, to some extent, be compensated by leveling the substrate relative to the image plane of the projection system as a function of the position of the slit on the substrate. However, in the direction perpendicular to the scanning direction the curvature may be relatively large without the possibility of correction.

SUMMARY

It is desirable to have a lithographic apparatus which provides an improved compensation for curvature of a substrate.

According to an aspect of the invention, there is provided a lithographic apparatus including an illumination system configured to condition a radiation beam; a patterning device support configured to support a patterning device, the patterning device capable of imparting the radiation beam with a pattern in its cross-section to form a patterned radiation beam; a substrate table constructed to hold a substrate; a projection system configured to project the patterned radiation beam in a scanning exposure along a scanning direction onto a target portion of the substrate, wherein the illumination system is configured to form in a plane of the patterning device a slit shaped image having a curved shape with a slit curvature in the scanning direction, the slit shaped image having a length in the scanning direction and a width substantially perpendicular to the scanning direction, the slit shaped image being configured to create a curved pattern image portion of the patterned radiation beam in an image plane of the projection system.

According to an aspect of the invention, there is provided device a manufacturing method which includes conditioning a radiation beam; imparting the radiation beam with a pattern in its cross-section to form a patterned radiation beam; projecting the patterned radiation beam in a scanning exposure along a scanning direction onto a target portion of a substrate; forming a slit shaped image, the slit shaped image having a length in the scanning direction and a width substantially perpendicular to the scanning direction, the slit shaped image having a curved shape with a slit curvature in the scanning direction; arranging the slit shaped image to create a curved pattern image portion of the patterned radiation beam in an image plane of the projection system.

According to an aspect of the invention, there is provided a computer program on a computer-readable medium to be loaded by an computer, the computer including a processor, memory, the memory being connected to the processor, the computer being interfaced with a lithographic apparatus for controlling the lithographic apparatus, the lithographic apparatus including an illumination system configured to condition a radiation beam; a patterning device support configured to support a patterning device, the patterning device capable of imparting the radiation beam with a pattern in its cross-section to form a patterned radiation beam; a substrate table constructed to hold a substrate, a projection system configured to project the patterned radiation beam in a scanning exposure along a scanning direction onto a target portion of the substrate, the illumination system being configured to form on the reticle a slit shaped image having a curved shape with a slit curvature in the scanning direction and having a length in the scanning direction and a width perpendicular to the scanning direction; the computer being arranged as a control system coupled to at least the illumination system for controlling actions of at least the illumination system; the computer program after being loaded allowing the processor to control the illumination system for: forming the slit shaped image, and arranging the slit shaped image for creating a curved pattern image portion of the patterned radiation beam in an image plane of the projection system.

According to an aspect of the invention, there is provided a computer product embedded in a machine readable medium including machine executable instructions configured to perform a device manufacturing method including forming a slit shaped image in a plane of a patterning device in a lithographic apparatus, the patterning device configured to pattern a radiation beam to form a patterned radiation beam, the slit shaped image having a length in the scanning direction and a width substantially perpendicular to the scanning direction, the slit shaped image having a curved shape with a slit curvature in the scanning direction, the slit shaped image formed to create a curved pattern image portion of the patterned radiation beam in an image plane of the projection system.

According to an aspect of the invention, there is provided a lithographic apparatus including a patterning device support configured to support a patterning device, the patterning device capable of imparting a radiation beam with a pattern in its cross-section to form a patterned radiation beam; a substrate table constructed to hold a substrate; a projection system configured to project the patterned radiation beam in a scanning exposure along a scanning direction onto a target portion of the substrate; and an illumination system configured to form in a plane of the patterning device an exposure slit to illuminate the patterning device, the exposure slit having a curved shape with a slit curvature in the scanning direction and a length in the scanning direction and a width substantially perpendicular to the scanning direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
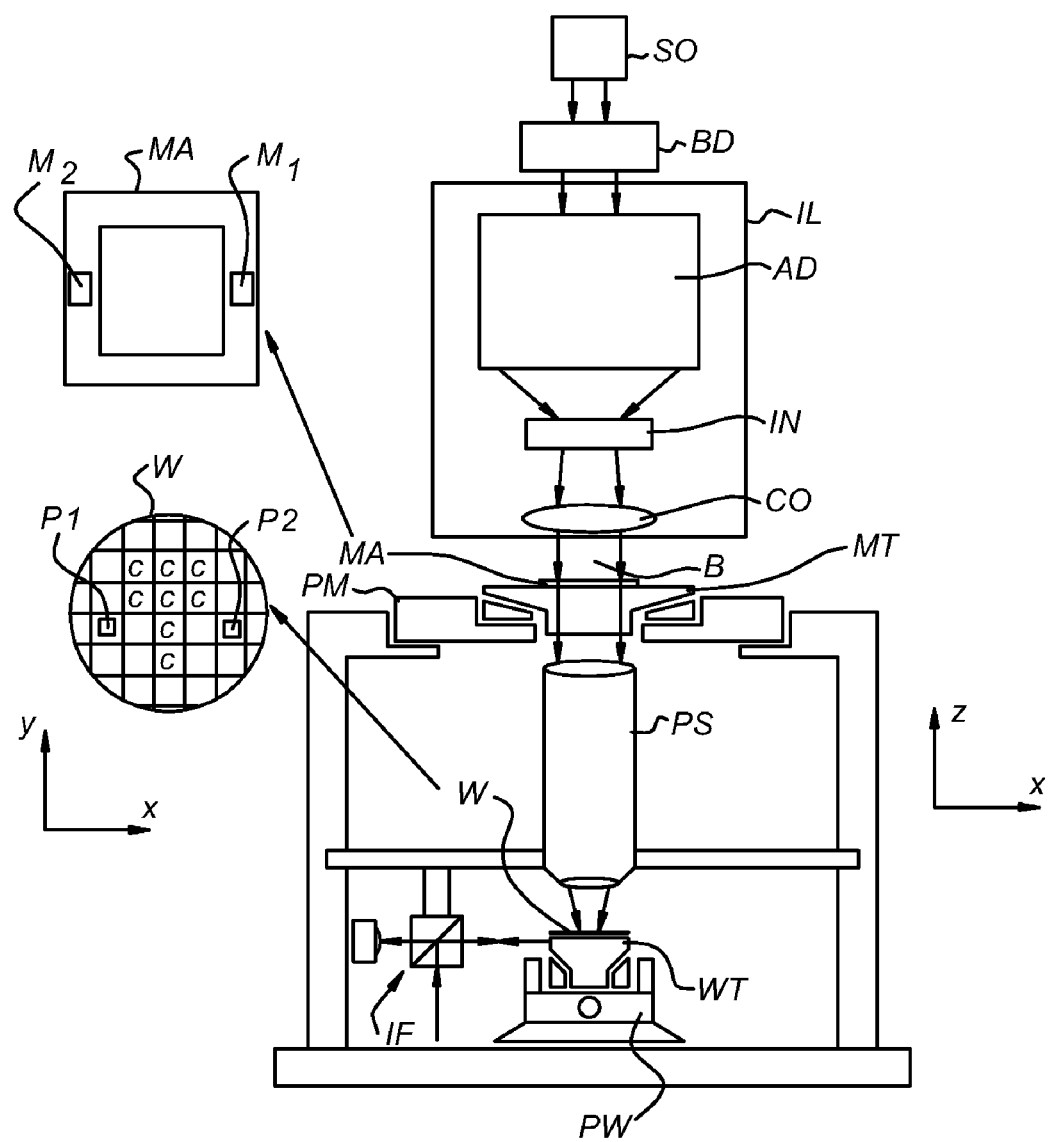
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the patterning device support or support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support or support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support or support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support or support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support or support structure (e.g mask table) MT and the substrate table WT are scanned synchronously while a pattern imparted to the radiation beam is projected onto a target portion C (i.e. a single dynamic exposure). The velocity and direction of the substrate table WT relative to the patterning device support or support structure (e.g mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a scanning exposure, an illumination profile of the radiation beam as shaped by the illuminator IL that is positioned above the reticle, is moved over the reticle to form an image of the pattern on the wafer. The illuminator IL produces a slit shaped image in a conjugate plane of the illumination system, i.e., in the plane of the reticle (or patterning device).

3. In another mode, the patterning device support or support structure (e.g mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
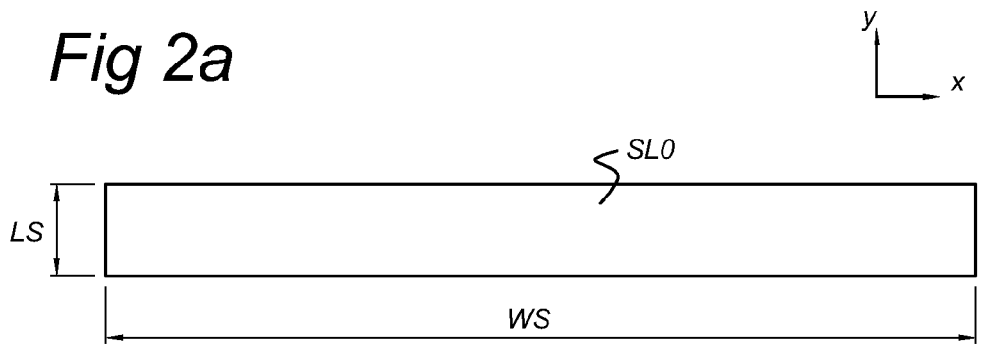
FIG. 2a depicts a conventional slit as used in a scanner lithographic apparatus.

FIG. 2a depicts a slit shaped image area SL0 (referred to as exposure slit) as used in the scanner lithographic apparatus from the prior art.

The exposure slit SL0 is created by the illuminator IL as described above.

Generally, the exposure slit SL0 has a substantially rectangular shape, having a width WS and a length LS. The exposure slit SL0 is positioned with its length LS parallel with the scanning direction Y. The width WS is substantially equal to the width of the exposure field.

The width of the exposure field may correspond to the width of at least one target portion C, although it may be possible that exposure field includes more than one target portions C that are adjacent to each other in the non-scanning direction X.

Figure 2B:
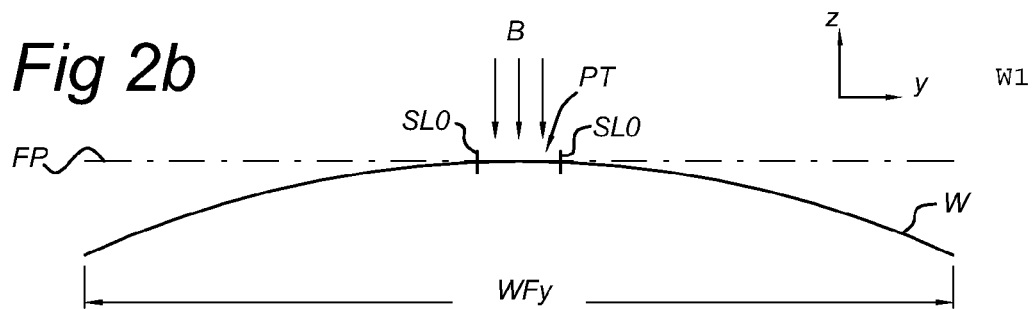
FIG. 2b depicts an illustration of the imaging of a pattern on a non-flat substrate surface.

FIG. 2b depicts a first illustration of the imaging of a pattern on a non-flat substrate surface using the conventional exposure slit.

In FIG. 2b a portion W1 of a substrate W is schematically shown in cross-sectional view along the scanning direction Y. A length WFy of the substrate portion W1 corresponds substantially to the length of the exposure field. The substrate portion W1 as shown is not flat and exhibits a local curvature which is shown in the vertical direction Z.

The person skilled in the art will appreciate that local curvature in a general sense is associated with level variations of the surface of the substrate. Curvature as a second order substrate surface unevenness is the first non-correctable after lower order surface unevenness as height and tilt. In practice, surface level variations may be several tens of nanometers.

Above the substrate portion W1 a vertical line FP is shown indicating the image plane (or focal plane) of the projection system.

Also a position of a pattern image portion PT that is exposed through the exposure slit SL0 is indicated by the position of the ends of the prior art slit.

During the scanning operation in which the pattern is exposed on the substrate, the lithographic apparatus is configured to bring at least the part of the substrate that is actually exposed within a distance range of the image plane to allow exposure of the pattern image with a defocus error smaller than a predetermined defocus error value. This operation, known as levelling, typically uses a substrate surface map which includes measurement data on the surface level as a function of the position on the substrate. The surface map may be constructed before the actual scanning exposure but alternatively the surface map may be constructed 'on the fly' or dynamically, i.e. during the scanning exposure. The skilled person will appreciate how to construct a surface map under these alternative conditions.

Based on the substrate surface map, the surface level is adjusted during scanning, by correlating the substrate surface map data with the actual position of the image portion as projected on the substrate during the scan. The leveling operation typically includes adjustments by translation along the Z-direction to adjust height and adjustments by rotation around the X- and/or Y-direction. These adjustments of the substrate in Z-direction and rotation around X- and/or Y direction hence assure the illuminated part of the substrate to be optimally positioned with respect to the image focus plane.

Figure 2C:
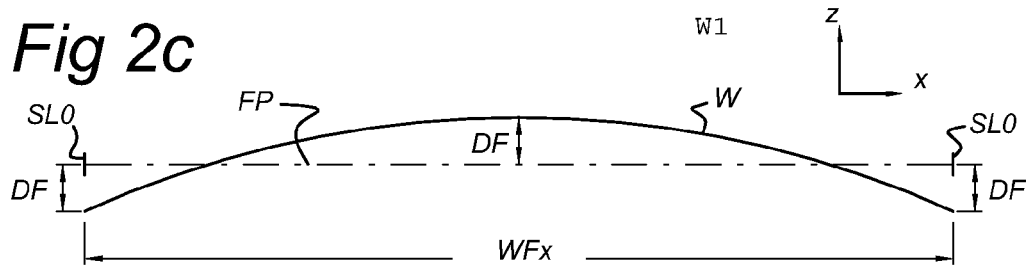
FIG. 2c depicts an illustration of the imaging of a pattern on a non-flat substrate surface.

FIG. 2c depicts a second illustration of the imaging of a pattern on a non-flat substrate surface using the conventional slit.

In FIG. 2c, a portion W1 of a substrate W is schematically shown in cross-sectional view along the non-scanning direction X. A length WFx of the substrate portion corresponds substantially with the width of the exposure field. The substrate portion W1 as shown is not flat and exhibits a local height variation which is shown in the vertical direction Z.

Above the substrate portion a vertical line FP is shown to indicate the image plane of the projection system. It is noted that the image plane of the projection system can be curved in some way. Usually lens settings are such that an image surface corresponds to a plane as close as possible.

Also, the position of the image portion PT that is exposed is indicated by the position of the ends of the conventional slit. Since in the non-scanning direction X the exposure slit SL0 has a width substantially equal to the width of the exposure field, it is desirable to compensate surface level variation over the full width of the exposure slit SL0.

To have an acceptable maximal defocus error over the full width of the exposure field in the non-scanning direction X, the image plane FP is chosen at an optimal level, which in some parts of the cross-section is above the surface level and in other parts is below the surface level. As a result some parts exhibit a local defocus error as indicated by arrows DF.

Since the width WS of the exposure slit SL0 corresponds substantially to the width of the exposure field, correction of surface level variations by the above described levelling operation is limited.

Figure 3:
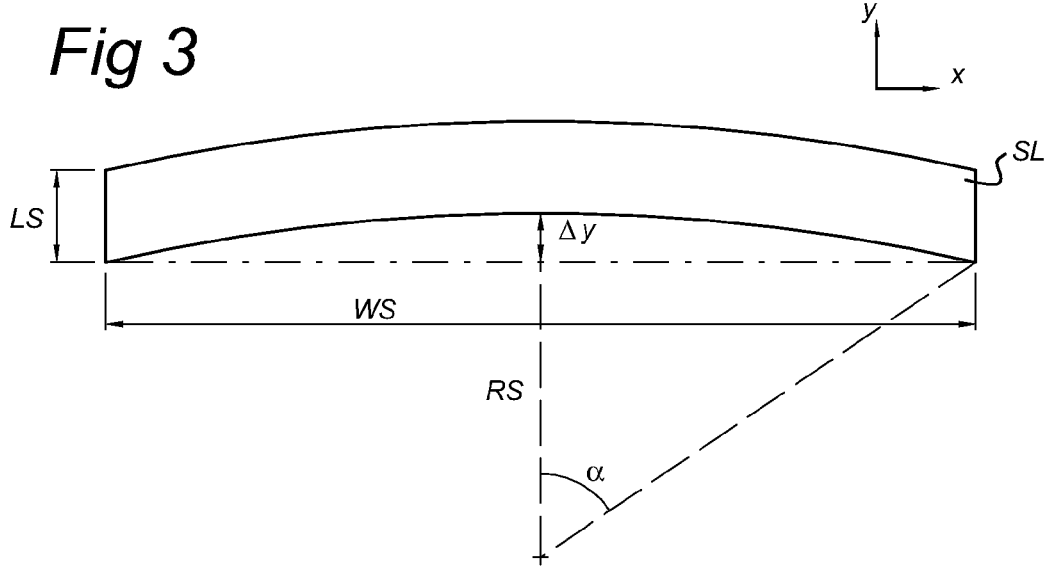
FIG. 3 depicts a slit according to an embodiment of the present invention.

FIG. 3 depicts an exposure slit according to an embodiment of the present invention.

An exposure slit SL according to an embodiment of the present invention has curved shape with a curvature $\Delta Y$ in the scanning direction Y. The exposure slit has a length LS along the scanning direction Y and a width WS in the non-scanning direction X.

In an embodiment, the length LS is substantially constant over the full width WS of the exposure slit. The width WS may correspond to the width of the exposure field.

In a further embodiment, the length LS may vary along the non-scanning direction to compensate for dose variation of radiation induced by the curved shape of the slit.

By using the exposure slit SL that is curved in the scanning direction Y, a benefit is that a substrate curvature in the Z-direction along the non-scanning direction X can be compensated by tilting the substrate along the X-direction during the scan. Also, it will be appreciated that the curvature along the scanning direction Y can still be compensated in the same way as done with the conventional slit.

In this embodiment, the curvature of the exposure slit SL is fixed. The pattern image that passes the slit now has curved pattern image shape within the image plane FP, which is still flat in Z-direction.

To compensate curvature in Z-direction along the non-scanning direction X, the lithographic apparatus is arranged to provide the substrate table WT with a tilt Rx along the non-scanning direction X, in such a way that the surface level or topology in its tilted position is substantially aligned with the image plane in which the curved pattern image shape is projected.

Thus, in this embodiment, the lithographic apparatus may adjust the height (in Z-direction) of the substrate surface relative to the level of the flat image plane as a function of the actual position of the image portion on the substrate during the scan. Additionally, the lithographic apparatus provides tilting of the substrate based on the curvature of the full exposure field that is under exposure.

The capability to provide a tilt Rx around an axis substantially perpendicular to the scanning direction and substantially parallel to the surface of the substrate and to adjust the surface height of the substrate can be achieved by constructional parts of the substrate table.

The curvature of the surface may be either convex or concave. As will be appreciated by the skilled person, tilting of the substrate along the X-direction may match the level of the image plane with either a convex or a concave surface.

In an embodiment, the substrate curvature in Z-direction along the X-direction is of the order of about −50 to about 50 nm over the slit width WS. The substrate table WT may be arranged for a maximal tilt angle Rx, max of up to about 50 μrad ($50 \times 10^{-6}$ rad) as compensation. This maximal tilt angle Rx, max corresponds to maximal substrate curvature along the X-direction divided by the curvature $\Delta Y$ of the curved exposure slit SL:

$$Rx, \max = 50 \times 10^{-9} / \Delta Y, \qquad \text{(eq. 1)}$$

(taking $\Delta Y$ in meters).

As a result of tilting over an angle Rx, some fading of the pattern image during exposure may occur depending on the actual value of Rx. Fading relates to a variation of the focus error along the scanning direction, while a defocus is defined as the mean focus error along the non-scanning direction. The induced fading for an exposure slit with slit length LS and the mentioned maximum tilt angle is given by:

$$Rx \times LS = 50 \times 10^{-9} \times LS / \Delta Y \qquad \text{(eq. 2)}$$

In an exemplary embodiment, a value of Rx×LS of about $15 \times 10^{-9}$ m may be acceptable as fading. Under these conditions, for a given local curvature (say 50 nm) and Rx, max (say 50 μrad) and a given slit length LS of say 2.5 mm, a curvature $\Delta Y$ of the exposure slit of about 8 mm results.

It is noted that the exposure slit according to an embodiment of the present invention can be used for improved focus control. Also, the curved shape of the slit may allow for a reduction of the size of optical components in the projection system, which may result in a reduction of some size-related aberrations of the projection system.

It is noted that the exposure slit according to an embodiment of the present invention is not limited to parabolic curvature in the XY plane (i.e., $Y \equiv X^2$) but in general may relate to any non-straight shape of the exposure slit SL.

In an embodiment, the exposure slit SL may be V-shaped. Alternatively, the exposure slit SL may have a stepped shape in the XY-plane.

In accordance with an embodiment of the present invention, there is provided a method for leveling a substrate during scanning exposure. In this method, a curve shaped slit SL is provided as scanner slit.

The method provides:—projecting a pattern image on the surface of the substrate using a scanning exposure in the scanning direction Y, in which the pattern image is exposed using the curve shaped exposure slit SL according to an embodiment of the present invention.

Due to the exposure by means of the curve shaped exposure slit SL, the pattern image includes a curved pattern image in the image plane of the projection system.

During the scanning exposure of the substrate in the lithographic apparatus as described above, the method provides:—obtaining scanning data of the position of the projected pattern image along the path of the scan on the substrate.

Then, the method provides:—measuring a surface shape of the substrate, after which either the measurement data are being represented in the substrate surface map or the measurement data are being used 'on the fly' as explained above.

Next, the method provides:—comparing the scanning data of the position of the projected pattern image along the path of the scan with the measurement data of the substrate surface map.

Then, the method provides:—adjusting the height of the surface level of the substrate relative to the level of the image plane in which the pattern image is projected, for each position along the path of the scan.

Further, the method provides:—tilting of the substrate, i.e. Rx tilt around the X-axis (along the non-scanning direction X). The tilting angle value is determined from the curvature value of the exposure field that is under exposure. The method provides a tilting angle value that allows that the curved surface level or topology in its tilted position is substantially matched with that of the image plane which includes the curved pattern image.

The method provides that the curvature value of the full exposure field is derivable from the substrate surface map.

It is noted that according to the method of an embodiment of the present invention, leveling (i.e., adjusting the height of the surface level and tilting the substrate) is an optimization of Rx tilt and fading versus local curvature, local tilt and height of the surface.

Moreover, the method is capable of providing either a static or a dynamic correction during scanning exposure.

In a static correction mode, an average Rx tilt is calculated per field and thus an average curvature per field is corrected. In a dynamic correction mode, a continuous optimization along the scan path is carried out in which Rx tilt is continuously adapted based on the local curvature within the fields.

An embodiment of the present invention also relates to a computer program that allows a lithographic apparatus equipped with an exposure slit SL with a curved shape with a curvature $\Delta Y$ in the scanning direction to carry out the method as described above.

In a further embodiment, the curvature of the exposure slit SL is variable and can be adapted by the relative positions of the reticle masking blades. Adapting the curvature may be carried out per field, or continuously during scanning.

Figure 4:
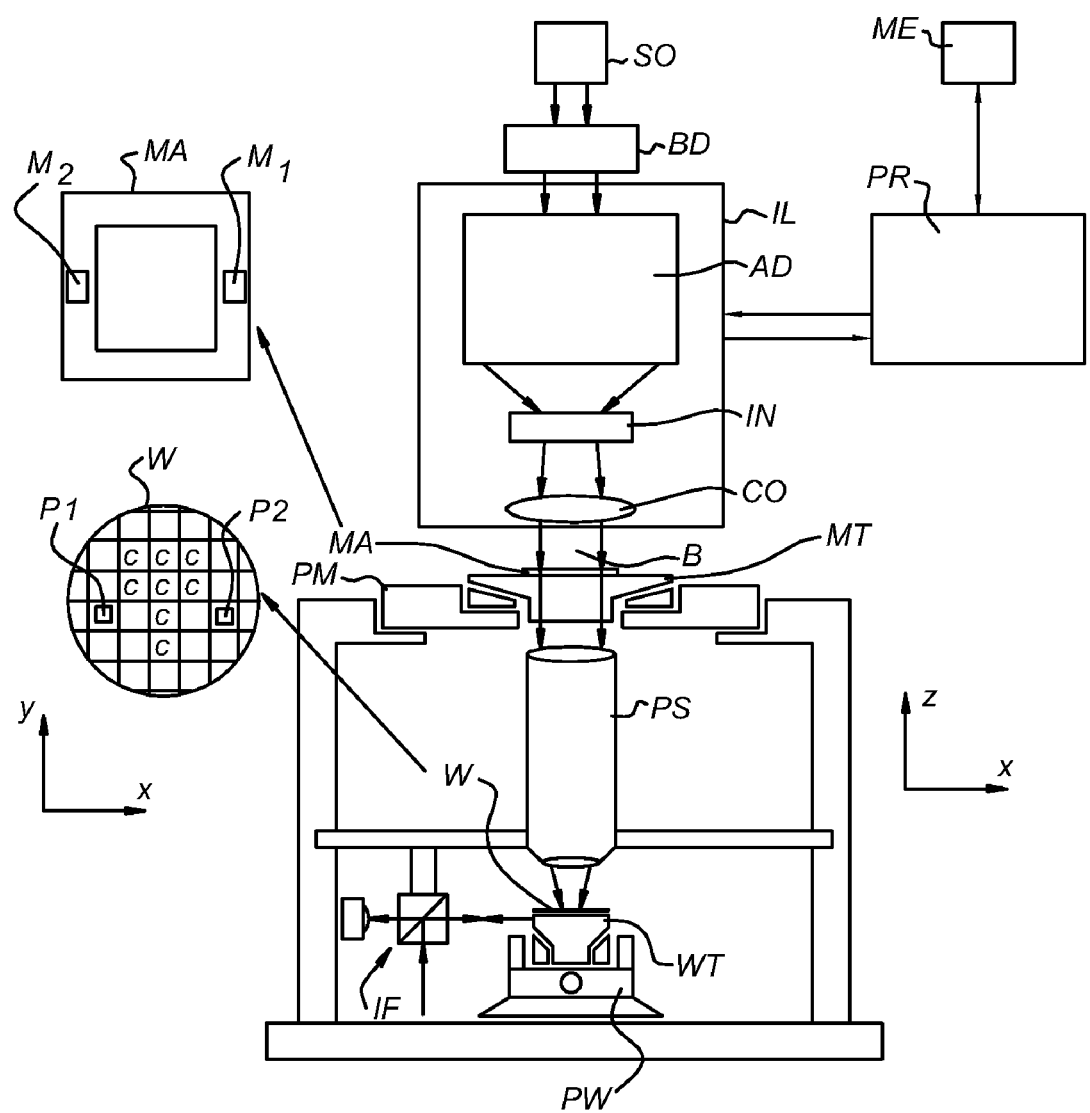
FIG. 4 depicts a lithographic apparatus according to an embodiment of the invention

In an embodiment, in order to carry out the method described above, thea lithographic apparatus may be equipped with a computer arrangement CA including a processor PR for performing arithmetical operations, and a memory ME. This is schematically depicted in FIG. 4, showing an example of a lithographic apparatus now further including the processor PR being arranged to communicate with memory ME. Memory ME may be any type of memory arranged to store instructions and data, such as a tape unit, hard disk, a Read Only Memory (ROM), Electrically Erasable Programmable Read Only Memory (EEPROM) and a Random Access Memory (RAM).

The processor PR may be arranged to read and execute programming lines stored in memory ME providing the processor PR with the functionality of controlling the lithographic apparatus to perform the method described above.

In order to be able to perform the method, the processor PR is interfaced (schematically shown by arrows A1, A2) with the lithographic apparatus to obtain scanning data that relate to the position of the projected pattern image along the path of the scan on the substrate and to control at least a position of the substrate table WT.

The position of the substrate table relates to a position defined in X, Y, Z coordinates and at least a tilting angle Rx along the X-direction.

Also, the processor PR has access to a surface map database within the memory ME which includes the substrate surface map of measurement data on the surface level as a function of the position on the substrate. Note that the processor may be capable of constructing the surface map before the actual scanning exposure and store the result in the surface map database.

Alternatively, the processor may be capable of constructing the surface map 'on the fly', in which case measurement values of the surface level as a function of the position on the substrate are obtained and used during the scanning exposure.

The processor PR may be a processor especially provided to perform one or more of the described embodiments of the method, but may also be a central processor arranged to control the lithographic apparatus as a whole and now is being provided with additional functionality to perform one or more of the described embodiments.

It should be understood that there may be provided more and/or other units, such as memory units, input devices and read devices known to persons skilled in the art. Moreover, one or more of them may be located remote from the processor PR, if desired. The processor PR is shown as one box, however, it may include several processing units functioning in parallel or in a master-slave arrangement that may be located remote from one another, as is known to persons skilled in the art.

It is observed that, although all connections in FIG. 4 are shown as wired connections, one or more of these connections can be made wireless. They are only intended to show that "connected" units are arranged to communicate with one another in some way. The computer system may be any signal processing system with analog and/or digital and/or software technology arranged to perform the functions discussed here.

The computer system shown in FIG. 4 is arranged to perform computations in accordance with the method of an embodiment of the present invention. The computer system is capable of executing a computer program (or program code) residing on a computer-readable medium which after being loaded in the computer system allows the computer system to carry out the method in accordance with an embodiment of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system configured to condition a radiation beam;
   a patterning device support configured to support a patterning device, the patterning device capable of imparting the radiation beam with a pattern in its cross-section to form a patterned radiation beam;
   a substrate table constructed to hold a substrate; and
   a projection system configured to project the patterned radiation beam in a scanning exposure along a scanning direction onto a target portion of the substrate,
   wherein the illumination system is configured to form in a plane of the patterning device a slit shaped image having a curved shape with a slit curvature in the scanning direction, the illumination system being configured to vary the slit curvature during the scanning exposure of the substrate,
   the slit shaped image having a length in the scanning direction and a width substantially perpendicular to the scanning direction, the slit shaped image configured to create a curved pattern image portion of the patterned radiation beam in an image plane of the projection system.

2. The lithographic apparatus according to claim 1, wherein the substrate table is configured to tilt a surface of the substrate around an axis substantially perpendicular to the scanning direction and substantially parallel to a surface of the substrate so as to allow alignment of the curved pattern image portion of the patterned radiation beam in the image plane of the projection system and a surface level of a surface portion illuminated by the patterned radiation beam, the tilt of the surface of the substrate determined by a local surface curvature along the scanning direction of the surface level of the surface portion.

3. The lithographic apparatus according to claim 1, wherein the substrate table is configured to provide an adjustment of a height of a surface level of a surface portion illuminated by the patterned radiation beam, the adjustment of the height determined by a local level of the surface level of the surface portion.

4. The lithographic apparatus according to claim 1, wherein the illumination system is configured to adapt the slit curvature of the curved shape along the scanning direction during the scanning exposure, the slit curvature adapted by determining a local surface curvature along the scanning direction of the surface level of the surface portion.

5. A device manufacturing method comprising:
conditioning a radiation beam;
imparting the radiation beam with a pattern in its cross-section to form a patterned radiation beam;
projecting the patterned radiation beam in a scanning exposure along a scanning direction onto a target portion of a substrate; and
forming a slit shaped image, the slit shaped image having a length in the scanning direction and a width substantially perpendicular to the scanning direction, the slit shaped image having a curved shape with a slit curvature in the scanning direction, the slit shaped image formed to create a curved pattern image portion of the patterned radiation beam in an image plane of the projection system,
wherein forming the slit shaped image comprises modifying the slit curvature during the scanning exposure of the substrate.

6. The device manufacturing method according to claim 5, comprising:
tilting a surface of the substrate around an axis substantially perpendicular to the scanning direction and substantially parallel to the surface of the substrate so as to allow alignment of the curved pattern image portion of the patterned radiation beam in the image plane of the projection system and a surface level of a surface portion illuminated by the patterned radiation beam, the tilting including determining a local surface curvature along the scanning direction of the surface level of the surface portion.

7. The device manufacturing method according to claim 5, comprising:
adjusting a height of a surface level of a surface portion illuminated by the patterned radiation beam, the adjusting determined by a local level of the surface level of the surface portion.

8. The device manufacturing method according to claim 7, comprising:
adapting the slit curvature of the curved shape along the scanning direction during the scanning exposure, the adapting including determining a local surface curvature along the scanning direction of the surface level of the surface portion.

9. The device manufacturing method according to claim 8, comprising:
constructing a surface map of surface level data of the surface level of the substrate as a function of position on the substrate,
wherein the surface level data relate to the local surface curvature along the scanning direction of the surface level of the surface portion.

10. A non-transitory computer-readable medium having machine executable instructions, the instructions being executable by a computer, the computer comprising a processor and a memory, the memory being connected to the processor, the computer being interfaced with a lithographic apparatus comprising:
an illumination system configured to condition a radiation beam;
a patterning device support configured to support a patterning device, the patterning device capable of imparting the radiation beam with a pattern in its cross-section to form a patterned radiation beam;
a substrate table constructed to hold a substrate; and
a projection system configured to project the patterned radiation beam in a scanning exposure along a scanning direction onto a target portion of the substrate,
wherein the illumination system is configured to form in a plane of the patterning device a slit shaped image having a curved shape with a slit curvature in the scanning direction and having a length in the scanning direction and a width substantially perpendicular to the scanning direction, the illumination system being configured to vary the slit curvature during the scanning exposure of the substrate;
wherein the computer is arranged as a control system to control at least the illumination system; and
wherein the instructions are executable by the computer to allow the processor to control the illumination system to:
form the slit shaped image, and
arrange the slit shaped image to create a curved pattern image portion of the patterned radiation beam in an image plane of the projection system.

11. The non-transitory computer-readable medium according to claim 10, wherein the computer is configured to control the substrate table, the computer program allowing the processor to control the substrate table so as to tilt a surface of the substrate around an axis substantially perpendicular to the scanning direction and substantially parallel to the surface of the substrate to allow alignment of the curved pattern image portion of the patterned radiation beam in the image plane of the projection system and a surface level of a surface portion illuminated by the patterned radiation beam, the tilt of the surface of the substrate determined by a local surface curvature along the scanning direction of the surface level of the surface portion.

12. A non-transitory machine readable medium including machine executable instructions configured to perform a device manufacturing method comprising:
forming a slit shaped image in a plane of a patterning device in a lithographic apparatus, the patterning device configured to pattern a radiation beam to form a patterned radiation beam, the slit shaped image having a length in the scanning direction and a width substantially perpendicular to the scanning direction, the slit shaped image having a curved shape with a slit curvature in the scanning direction, the slit shaped image formed to create a curved pattern image portion of the patterned radiation beam in an image plane of the projection system,
wherein forming the slit shaped image comprises modifying the slit curvature during the scanning exposure of an exposed substrate.

13. The non-transitory machine readable medium according to claim 12, wherein the method further comprises
conditioning the radiation beam;
patterning the radiation beam to form the patterned radiation beam; and
projecting the patterned radiation beam in a scanning exposure along a scanning direction onto a target portion of the substrate.

14. A lithographic apparatus comprising:
a patterning device support configured to support a patterning device, the patterning device capable of imparting a radiation beam with a pattern in its cross-section to form a patterned radiation beam;
a substrate table constructed to hold a substrate;
a projection system configured to project the patterned radiation beam in a scanning exposure along a scanning direction onto a target portion of the substrate; and
an illumination system configured to form in a plane of the patterning device an exposure slit to illuminate the patterning device, the exposure slit having a curved shape with a slit curvature in the scanning direction and a length in the scanning direction and a width substantially perpendicular to the scanning direction, the illumination system being configured to vary the slit curvature during the scanning exposure of the substrate.

15. The lithographic apparatus according to claim 14, wherein the illumination system is configured to adapt the slit curvature along the scanning direction during the scanning exposure.

16. The lithographic apparatus according to claim 1, wherein the illumination system is configured to vary the slit curvature before field exposure.

17. The device manufacturing method according to claim 5, wherein the slit curvature is modified before field exposure.

18. The lithographic apparatus according to claim 14, wherein the illumination system is configured to vary the slit curvature before field exposure or during scanning exposure.

19. The lithographic apparatus according to claim 1, wherein the illumination system includes a plurality of masking blades and wherein the slit curvature is varied by adjusting the position of the masking blades.

* * * * *